United States Patent
Bessette et al.

(10) Patent No.: US 8,925,170 B2
(45) Date of Patent: Jan. 6, 2015

(54) METHOD FOR REMOVING AN ELECTRONIC COMPONENT FROM A SUBSTRATE

(75) Inventors: Yvan Bessette, Granby (CA); Eric Bouchard, Canton de Granby (CA); Nicolas Boyer, Canton d'Orford (CA); Camille Dube, Bromont (CA); Eric Dube, Bromont (CA); Sarah Turgeon, Shefford (CA)

(73) Assignee: International Business Machines Corporation, Armonk, NY (US)

( * ) Notice: Subject to any disclaimer, the term of this patent is extended or adjusted under 35 U.S.C. 154(b) by 929 days.

(21) Appl. No.: 13/092,251

(22) Filed: Apr. 22, 2011

(65) Prior Publication Data

US 2012/0266459 A1   Oct. 25, 2012

(51) Int. Cl.
  *B23P 19/00*  (2006.01)
  *H05K 3/22*   (2006.01)
  *B23K 1/018*  (2006.01)
  *H05K 3/34*   (2006.01)
  *H05K 13/04*  (2006.01)

(52) U.S. Cl.
  CPC ........... *H05K 3/225* (2013.01); *B23K 1/018* (2013.01); *H05K 3/3494* (2013.01); *H05K 13/0486* (2013.01); *H05K 2203/043* (2013.01); *H05K 2203/082* (2013.01); *H05K 2203/1121* (2013.01); *H05K 2203/1509* (2013.01); *H05K 2203/1581* (2013.01); *H05K 2203/176* (2013.01)
  USPC .......... 29/426.5; 29/426.1; 228/191; 228/222

(58) Field of Classification Search
  CPC .............. H05K 3/225; H05K 13/0486; H05K 2203/176
  USPC ................... 29/426.1, 426.5, 832, 840, 743; 228/180.21, 191, 222, 264
  See application file for complete search history.

(56) References Cited

U.S. PATENT DOCUMENTS

| | | |
|---|---|---|
| 3,710,432 A | 1/1973 | Dieffenbacher et al. |
| 4,066,204 A | 1/1978 | Wirbser et al. |

(Continued)

FOREIGN PATENT DOCUMENTS

| | | |
|---|---|---|
| CH | WO2005046300 A2 | 5/2005 |
| JP | 2004047861 A | 2/2004 |

OTHER PUBLICATIONS

Schafer, Scott, "Semiconductor Equipment Corporation Application Bulletin—Rework of Underfilled Flip Chips," Semiconductor Equipment Corporation—Application Notes, Jun. 15, 2000, last accessed at http://www.semicorp.com/articles/applications/rework-of-underfilled-flip-chips.html.

(Continued)

*Primary Examiner* — Donghai D Nguyen
(74) *Attorney, Agent, or Firm* — Nelson and Nelson; Daniel P. Nelson; Alexis V. Nelson

(57) ABSTRACT

A system and method for removing an electronic component from a substrate is described. In one embodiment, a method in accordance with the invention includes initially preheating a substrate, wherein an electronic component (such as a microchip or discrete electronic component) is attached to the substrate by one or more solder connections. A thermally conductive picker head is applied to the electronic component to quench the electronic component and generate a temperature gradient across the solder connections. Tension is applied to the electronic component using the picker head. The substrate is then heated until a melting point is reached at the interface between the substrate and the solder connections. When the melting point is reached, the tension applied by the picker head removes the electronic component from the substrate. Most if not all of the solder associated with the solder connections is removed with the electronic component.

11 Claims, 5 Drawing Sheets

(56) References Cited

U.S. PATENT DOCUMENTS

| | | | |
|---|---|---|---|
| 4,569,473 A * | 2/1986 | Guiliano | 228/264 |
| 4,799,617 A * | 1/1989 | Friedman | 228/180.21 |
| 4,921,564 A | 5/1990 | Moore | |
| 4,954,453 A | 9/1990 | Venutolo | |
| 5,065,933 A | 11/1991 | Basavanhally | |
| 5,154,793 A | 10/1992 | Wojnarowski et al. | |
| 5,219,520 A | 6/1993 | Brofman et al. | |
| 5,284,286 A | 2/1994 | Brofman et al. | |
| 5,605,277 A | 2/1997 | Jackson et al. | |
| 5,738,267 A | 4/1998 | Olson et al. | |
| 5,862,588 A * | 1/1999 | Heim et al. | 29/840 |
| 6,472,234 B2 | 10/2002 | Ozawa | |

OTHER PUBLICATIONS

Moore, Don, "Reworking Underfilled Flip Chips," flipchips.com, May, 2001, last accessed at http://www.flipchips.com/tutorial08.html.

Skyworks Solutions Inc., "Diode Chips, Beam-Lead Diodes, Capacitors: Bonding Methods and Packaging," Feb. 26, 2007, last accessed at www.skyworksinc.com/uploads/documents/200532A.pdf.

Barger, Walt, "Tech Tips: Flip Chip Rework," EMPFasis, A publication of the National Electronics Manufacturing Center of Excellence, Apr. 2010, last accessed at http://www.empf.org/empfasis/2010/Apr10/tech_tips_410.html.

* cited by examiner

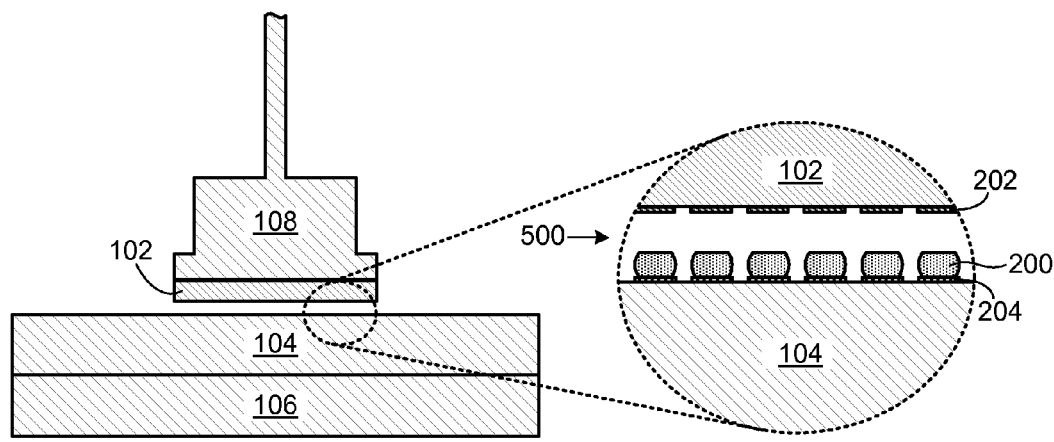
Fig. 5
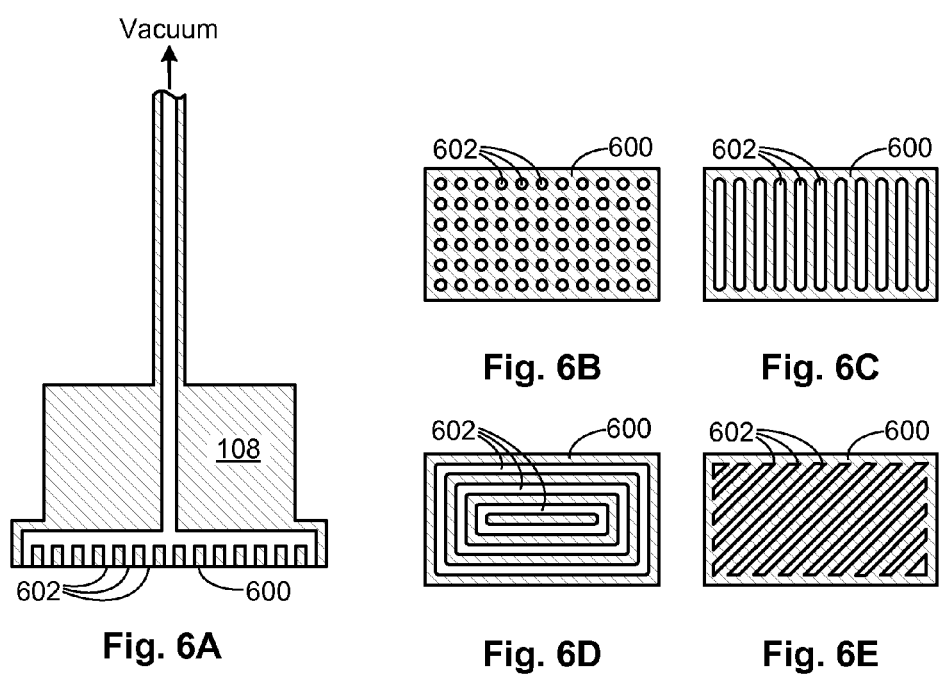
Fig. 6A
Fig. 6B
Fig. 6C
Fig. 6D
Fig. 6E

METHOD FOR REMOVING AN ELECTRONIC COMPONENT FROM A SUBSTRATE

BACKGROUND

1. Field of the Invention

This invention relates to systems and methods for removing electronic components, such as microchips, from substrates.

2. Background of the Invention

High-end microelectronic modules often include one or more microchips mounted to a carrier to provide a desired level of performance and functionality. Often, one or more microchips on a carrier substrate need to be replaced to repair and/or improve the performance of a microelectronic module. When removing a microchip, the solder on the carrier pads underneath the microchip also typically needs to be removed so that another microchip can be attached.

Several techniques currently exist for removing solder from carrier pads or other parts of a substrate. One technique involves utilizing a porous metal block to remove solder from a substrate. Such a porous metal block may include protrusions that are placed in contact with molten solder on the substrate to absorb the solder through capillary action. The porous metal block may be designed with an interconnected and uniform porosity that provides uniform absorption across the block surface. The number and dimensions of the protrusions on the block may vary based on the application. Although effective, this technique can be costly and time-consuming.

Another technique is to use an acid such as nitric acid to dissolve the solder on the carrier. For example, the solder may be removed by dipping the substrate in fuming nitric acid. Unfortunately, such a technique can contaminate the substrate surface and may be difficult to implement for chip removal. Furthermore, acids such as nitric acid can be hazardous and difficult to handle. Nitric acid in particular is corrosive, reactive, and dangerous to touch or inhale.

In view of the foregoing, what are needed are systems and methods to remove electronic components, such as microchips, from carrier substrates. Ideally, such systems and methods would be effective to remove most if not all of the solder that connects the electronic components to the substrates. Such systems and methods would also ideally not require chemicals such as fluxes or cleaning agents to remove the solder.

SUMMARY

The invention has been developed in response to the present state of the art and, in particular, in response to the problems and needs in the art that have not yet been fully solved by currently available systems and methods. Accordingly, the invention has been developed to provide systems and methods to remove electronic components, such as microchips, from carrier substrates. The features and advantages of the invention will become more fully apparent from the following description and appended claims, or may be learned by practice of the invention as set forth hereinafter.

Consistent with the foregoing, a method for removing an electronic component from a substrate is disclosed herein. In one embodiment, such a method includes initially preheating a substrate, wherein an electronic component (such as a microchip or discrete electronic component) is attached to the substrate by one or more solder connections. A thermally conductive picker head is applied to the electronic component to quench the electronic component and generate a temperature gradient across the solder connections. Tension is applied to the electronic component using the picker head. The substrate is then heated until a melting point is reached at the interface between the substrate and the solder connections. When the melting point is reached, the tension applied by the picker head removes the electronic component from the substrate. Most if not all of the solder associated with the solder connections is removed with the electronic component.

In another aspect of the invention, a system for removing an electronic component from a substrate is disclosed herein. In one embodiment, such a system includes a heating device to heat a substrate, wherein an electronic component such as a microchip is attached to the substrate by one or more solder connections. A thermally conductive picker head is placed in physical contact with the electronic component to quench the electronic component and generate a temperature gradient across the one or more solder connections. The thermally conductive picker head includes a flat contact surface that is distributed substantially evenly across the electronic component. This enables heat to be conducted from the electronic component evenly, thereby generating a uniform temperature gradient across the solder connections. This will allow the electronic component along with most or all of the solder to be removed from the substrate.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 5 shows an alternative third stage of a component removal process where the interface between the solder connections and the electronic component is heated to the melting point and the electronic component is removed from the substrate to leave most if not all of the solder on the substrate;

FIG. 6A shows one example of a picker head used to effectively quench an electronic component and create a desired temperature gradient across the solder connections;

FIGS. 6B through 6E show various patterns of apertures on a contact surface of the picker head to enable the picker head to more evenly convey heat away from the electronic component;

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
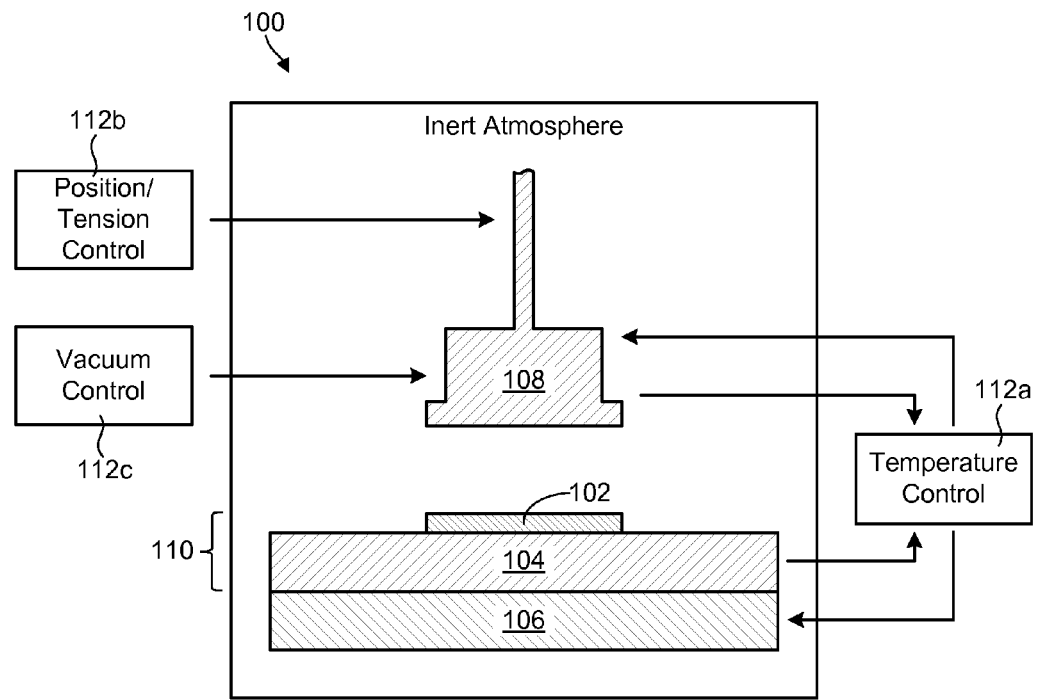
FIG. 1 is a high-level block diagram showing one example of a system for removing an electronic component from a substrate.

Referring to FIG. 1, one example of a system 100 for removing an electronic component 102 from a substrate 104 is illustrated. For the purposes of this disclosure, an "electronic component" may include a microchip, a semiconductor die, a discrete electronic component, or other electronic circuit or device. Similarly, a "substrate" may include a printed circuit board (PCB), ceramic-based substrate, or other carrier substrate used to mechanically support and electrically connect electronic components. The electronic component 102 and substrate 104 together form part of a "microelectronic module" 110, which may also include other electronic components such as other chips or discrete components.

As shown, the system 100 includes a heating device 106 to heat the substrate 104 to a desired temperature. The heating device 106 may heat the substrate 104 by one or more of conduction (e.g., a heat plate), radiation (e.g., an infrared heater), or convection (e.g., hot air) through the underside of the substrate 104. A thermally conductive picker head 108 is provided to physically attach to and quench (i.e., cool) the electronic component 102. Ideally, the picker head 108 uses vacuum to attach to the electronic component 102. Alternatively, the picker head 108 could include mechanical means to physically grip the electronic component. Whatever the physical attachment means used, the picker head 108 is designed to create an intimate bond with the electronic component 102 to provide a good thermal interface. As will be explained in more detail hereafter, quenching the electronic component 102 will produce a desired temperature gradient across solder connections (e.g., lead or lead-free solder connections) electrically connecting the electronic component 102 to the substrate 104. When the electronic component 102 is removed, the temperature gradient will ideally enable the solder connections to be removed from the substrate 104 with the electronic component 102, thereby providing a clean substrate 104 that will allow a new electronic component 102 to be attached.

One or more control modules 112a-c may be provided to control the heating device 106 and the picker head 108. A temperature control module 112a may be used to control the temperature of the heating device 106. The temperature control module 112a may also optionally control a heating or cooling device in the picker head 108. A position/tension control module 112b may control the position of the picker head 108 and/or the tension placed on the electronic component 102 by the picker head 108. For example, the position/tension control module 112b may raise or lower the picker head 108 with respect to the electronic component 102 or place a desired amount of tension on the electronic component 102 after the picker head 108 has attached to the electronic component 102. A vacuum control module 112c may control the vacuum needed to physically attach to the electronic component 102. Each of the control modules 112a-c may operate in an automated fashion (such as using computers, electronic controllers, or the like) or provide manual controls for operation by users. The control modules 112a-c may be embodied as different modules or may be integrated into a single module.

In selected embodiments, the system 100 is operated in an inert atmosphere to minimize oxidation. For example, the system 100 may be operated in a chamber filled with an inert gas (e.g., $N_2$) or mixture of gases. This will reduce or minimize the oxidation of solder connections, carrier pads, or other materials during the component removal process.

Figure 2:
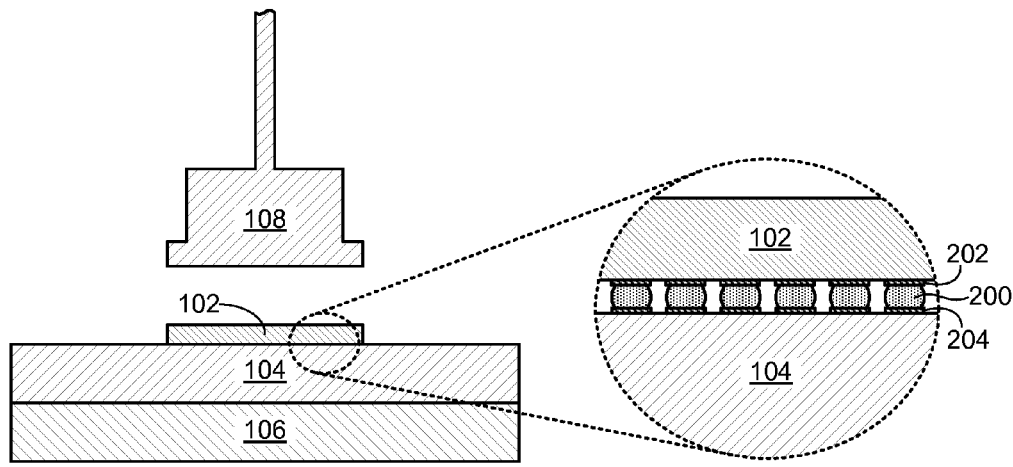
FIG. 2 shows a first stage of a component removal process wherein a substrate of an electronic module is preheated.

Referring to FIG. 2, a diagram showing a first stage of a component removal process is illustrated. In this stage, the picker head 108 is separated from the electronic component 102 and the substrate 104 is preheated to a temperature below the melting point of the solder connections 200. While the substrate 104 is preheated, the picker head 108 is maintained at a temperature significantly below the temperature of the substrate 104. This can be accomplished, for example, by keeping the picker head 108 a significant distance away from the heating device 106 or by cooling or maintaining the picker head 108 at a desired temperature with a cooling device, heat dissipation device, or the like. The solder connections 200 between the electronic component 102 and the substrate 104 may include solder balls, C4 connections, solder column connections, or the like. The solder connections 200 may connect metalized pads 202 on the electronic component 102 to metalized pads 204 on the substrate 104.

Figure 3:
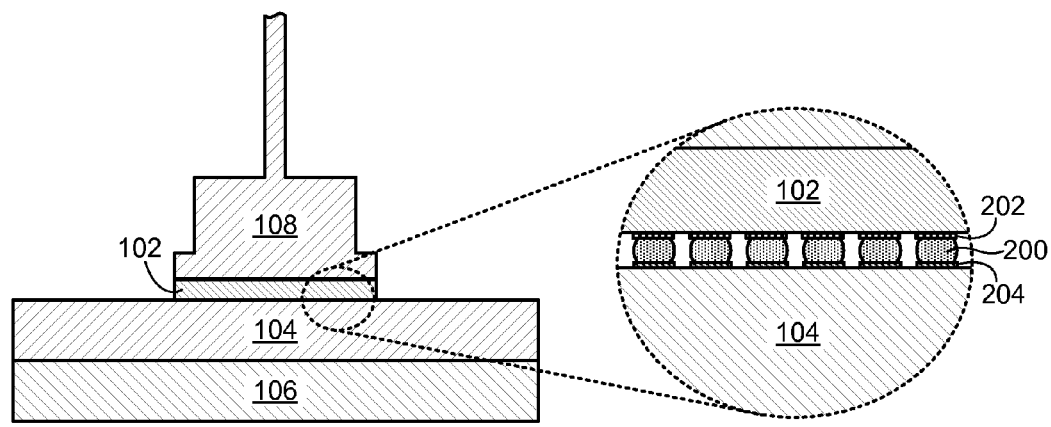
FIG. 3 shows a second stage of a component removal process wherein a picker head attaches to and quenches an electronic component.

Referring to FIG. 3, a diagram showing a second stage of a component removal process is illustrated. In this stage, once the substrate 104 is preheated to a desired temperature below the melting point of the solder connections 200, the picker head 108 is brought into contact with the electronic component 102. This quenches the electronic component 102 to generate a large temperature gradient across the electronic module 110, and more particularly across the solder connections 200. As will be explained in more detail hereafter, the picker head 108 may be designed in such a way that heat is quickly and evenly conveyed away from the electronic component 102, thereby producing a substantially even in-plane temperature across the electronic component 102. This will help to ensure that the solder connections 200 reach the melting point at substantially the same time. For a similar reason, the heating device 106 should be designed to provide substantially even heating of the substrate 104.

Once the picker head 108 is brought into contact with the electronic component 102, the vacuum is activated to enable the picker head 108 to attach to the component 102. This will allow tension to be applied to the electronic component 102 in a direction substantially perpendicular to the substrate 104. This will also create more intimate contact between the picker head 108 and the electronic component 102 to improve the thermal interface. If desired, a thermally conductive material (such as a compliant thermal interface) may be placed between the picker head 108 and the electronic component 102 to improve the thermal interface. Ideally, the mating surfaces of the picker head 108 and the electronic component 102 are as flat as possible to prevent or reduce vacuum leaks and provide a good physical bond. Vacuum leaks are undesirable not only because of the reduction in attachment strength, but also because leaks may create hot or cold spots on the electronic component 102, which may in turn cause different solder connections 200 to reach the melting point at different times.

Figure 4:
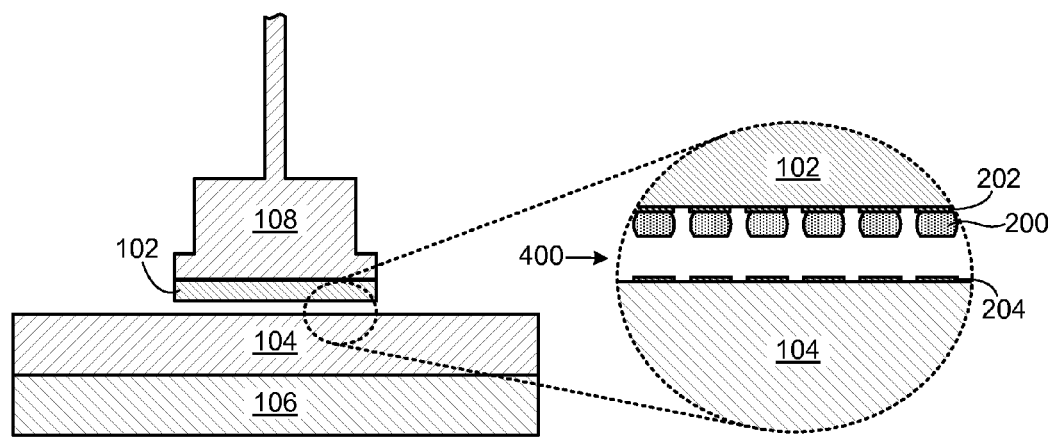
FIG. 4 shows a third stage of a component removal process wherein an interface between solder connections and a substrate is heated to a melting point and an electronic component is removed from the substrate along with most if not all of the solder associated with the solder connections.

Referring to FIG. 4, a diagram showing a third stage of a component removal process is illustrated. In this stage, once the picker head 108 has quenched the electronic component 102 and placed the electronic component 102 under a state of tension, the temperature of the substrate 104 is ramped up until the solder connections 200 reach the melting point at the interface 400 between the substrate 104 (and more specifically the carrier pads 204 on the substrate 104) and the solder connections 200. The ramp rate may be optimized to achieve the highest temperature gradient (achieved with a higher ramp rate) while maintaining in-plane temperature uniformity (achieved with a lower ramp rate). In selected embodiments, the ramp rate is between 0.1 and 2 degrees C. per second. The in-plane temperature uniformity may also depend on factors such as the gas flow rate through the chamber, the characteristics of the heating device 106, the substrate 104 thermal properties, the picker head 108 thermal properties, and the like.

Once the melting point is reached, the tension on the electronic component 102 causes the electronic component 102 to separate from the substrate 104. As shown, because melting occurs first at or near the interface 400 been the carrier pads 204 and the solder connections 200, most if not all of the solder is removed with the electronic component 102, leaving a minimal amount of solder on the carrier pads 204. This will ideally allow another electronic component 102 to be attached to the substrate 104 with minimal cleaning of the carrier pads 204. This result is attributable at least in part to the large temperature gradient generated across the solder connections 200.

Referring to FIG. 5, a diagram showing an alternative embodiment of a third stage of a component removal process is illustrated. In this embodiment, the temperatures of the picker head 108 and the substrate 104 are reversed to generate a temperature gradient in the opposite direction. This will cause the solder connections 200 to first reach the melting point at the interface 500 between the solder connections 200 and the metalized pads 202 of the electronic component 102. Once the melting point is reached, the electronic component 102 separates from the substrate 104, leaving most if not all of the solder on the substrate 104. Such an embodiment may be useful where the electronic component 102 is to be reused or the substrate 104 is to be discarded. Because of the large temperature gradient across the solder connections 200, most if not all of the solder is removed from the electronic component 102.

Referring to FIG. 6A, as previously mentioned, the picker head 108 may be designed in such a way that heat is quickly and evenly conveyed away from the electronic component 102. This will ideally produce a substantially even in-plane temperature across the electronic component 102. At the same time, the picker head 108 is designed to attach to and apply a pull force on the electronic component 102 using the vacuum previously described. In certain embodiments, the picker head 108 is designed to exert a constant pull force in the range of 0.1 to 5 kgf.

In selected embodiments, the picker head 108 is designed with a substantially flat contact surface 600 which is distributed substantially evenly across the electronic component 102. This will ideally achieve a substantially uniform in-plane temperature. In certain embodiments, this may be accomplished by providing a number of apertures 602 evenly distributed across the contact surface 600 to apply vacuum to the electronic component 102. This design will eliminate large gaps or holes in the thermal interface that may create hot or cold spots on the electronic component 102. FIGS. 6B through 6E show various examples of a contact surface 600 with apertures 602 that is designed to apply a vacuum to an electronic component 102 while still creating a good thermal interface. As can be observed from each of the embodiments, contact areas are provided across the contact surfaces 600, without large gaps or holes, to provide effective heat dissipation.

Other characteristics of the picker head 108, such as the mass of the picker head 108, the material of the picker head 108, and the temperature control of the picker head 108 may also affect the speed at which heat is conveyed away from the electronic component 102. In selected embodiments, the picker head 108 is fabricated from a highly thermally conductive metal, such as aluminum or copper, to convey heat away from the electronic component 102. In other embodiments, materials such as diamond, polycrystalline diamond (PCD), or the like may be used to convey heat away from the electronic component 102. As previously mentioned, materials such as thermal greases or pastes may be used at the interface between the picker head 108 and the electronic component 102 to improve the thermal conductivity.

Figure 7:
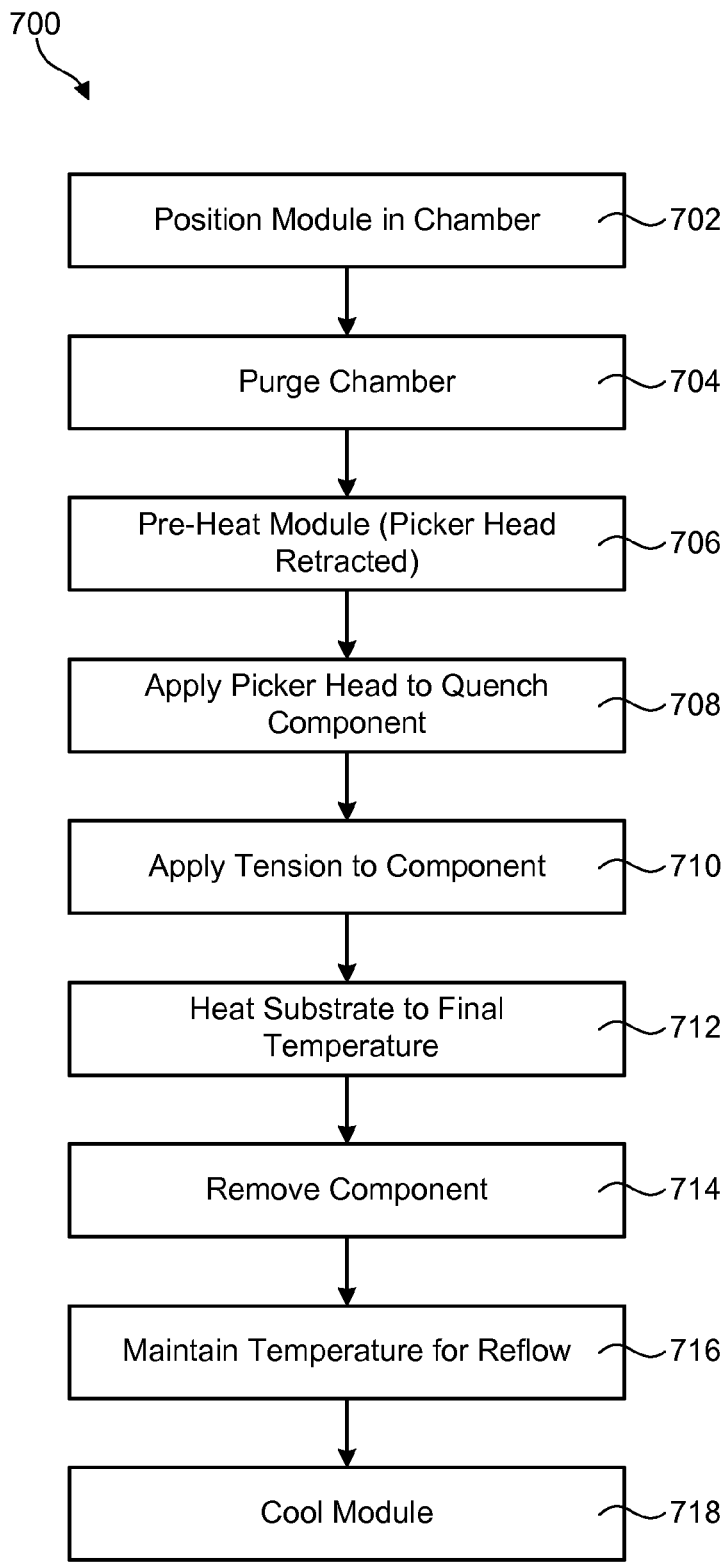
FIG. 7 is a flow chart showing one embodiment of a method for removing an electronic component from a substrate.

Referring to FIG. 7, one embodiment of a method 700 for removing an electronic component 102 from a substrate 104 is illustrated. Such a method 700 may be used with the hardware illustrated in FIGS. 1 through 6 or with other hardware. As shown, the method 700 initially positions 702 an electronic module 110 in a chamber. Positioning 702 the electronic module 110 may include placing the electronic module 110 on a heating device 106 and aligning the electronic module 110 beneath a picker head 108 using guide pins or other alignment means. Once the electronic module 110 is positioned 702 in the chamber, the chamber is purged 704 of oxidizing gases. In certain embodiments, a purge time may be allowed to pass to allow the chamber to reach low enough oxygen content. Purging 704 may also include replacing the oxidizing gases with an inert gas or mixture of gases such as nitrogen gas.

Once the chamber is purged 704 of oxidizing gases, the method 700 preheats 706 the electronic module 110 to a temperature below the melting point of the solder connections 200, such as 1 to 30 degrees C. below the melting point. At this point the picker head 108 is separated from the electronic component 102 and cooled or maintained at a temperature below that of the electronic module 110, such as at or near ambient temperature. The picker head 108 is then applied 708 to the electronic component 102 to quench the electronic component 102 and generate a temperature gradient across the electronic module 110. In selected embodiments, using the techniques described herein, a temperature gradient of greater than 100° C. may be generated across the electronic module 110. Applying 708 the picker head 108 may also include activating the vacuum to cause the picker head 108 to attach to and quench the electronic component 102. Once the picker head 108 has attached to the electronic component 102, tension is applied 710 to the electronic component 102. In certain embodiments, the tension is enough to generate about 0.02 to 0.5 MPa of stress on the solder connections 200. In certain embodiments, the tension is applied to the electronic component 102 in a direction substantially perpendicular to the substrate 104.

The substrate 104 is then heated 712 until the solder connections 200 reach the melting point at or near the interface 400 between the solder connections 200 and the carrier pads 204 of the substrate 104. When the melting point is reached, the tension applied by the picker head 108 will remove 714 the electronic component 102 from the substrate 104 along with most if not all of the solder. Upon removal, the electronic module 110 may be maintained at a temperature above the solder melting point to allow any residual solder on the substrate 104 to reflow. The electronic module 110 may then be cooled down in a controlled environment (e.g., an inert atmosphere) until the temperature of the electronic module 110 is low enough to avoid oxidation.

Figure 8:
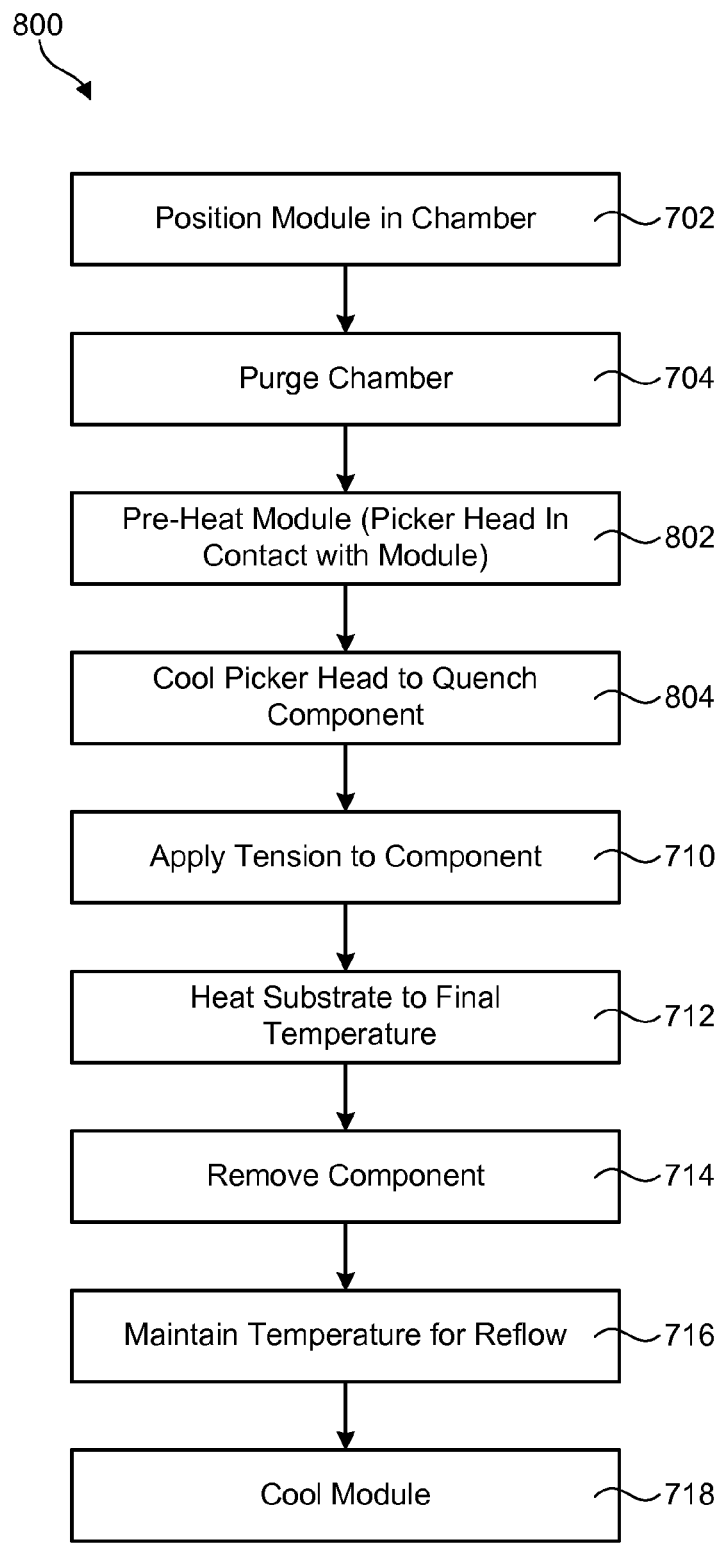
FIG. 8 is a flow chart showing an alternative embodiment of a method for removing an electronic component from a substrate.

Referring to FIG. 8, an alternative embodiment of a method 800 for removing an electronic component 102 from a substrate 104 is illustrated. As shown, the method 800 is substantially identical to the method 700 illustrated in FIG. 7, except that the method steps 706, 708 have been changed. In this embodiment, instead of keeping the picker head 108 separated from the electronic module 110 during a preheat step 802, the picker head 108 is placed in contact with the electronic module 110. Upon completing the preheat step 802, the picker head 108 is cooled to a desired temperature using a cooling device, heat dissipation device, or the like. This will quench the electronic component 102 to generate a desired temperature gradient across the electronic module 110. Once a desired temperature gradient is achieved, the substrate 104 is ramped 712 to a final temperature and the electronic component 102 is removed 714 in the manner previously described.

The systems and methods disclosed herein may be embodied in other specific forms without departing from their spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method for removing an electronic component from a substrate, wherein the electronic component is attached to the substrate by at least one solder connection, the method comprising:
    preheating the substrate;
    applying a thermally conductive picker head to the electronic component to quench the electronic component and generate a temperature gradient across the electronic component and substrate;
    applying, using the thermally conductive picker head, tension to the electronic component while drawing heat away from the electronic component through a thermally conductive interface between the electronic component and the thermally conductive picker head;
    heating the substrate until a melting point is reached at an interface between the substrate and the at least solder connection; and
    removing the electronic component from the substrate.

2. The method of claim 1, wherein heating the substrate comprises at least one of heating the substrate by conduction, heating the substrate by radiation, and heating the substrate by convection.

3. The method of claim 1, wherein the temperature gradient is greater than 100° C.

4. The method of claim 1, further comprising cooling the thermally conductive picker head to increase the temperature gradient.

5. The method of claim 4, wherein cooling comprises pre-cooling the thermally conductive picker head prior to applying the thermally conductive picker head to the electronic component.

6. The method of claim 4, wherein cooling comprises cooling the thermally conductive picker head after applying the thermally conductive picker head to the electronic component.

7. The method of claim 1, further comprising regulating a temperature of the thermally conductive picker head to control the temperature gradient.

8. The method of claim 1, wherein applying the thermally conductive picker head to the electronic component comprises applying a vacuum to the electronic component.

9. The method of claim 8, wherein applying the thermally conductive picker head to the electronic component comprises applying a substantially flat contact surface to the electronic component.

10. The method of claim 9, wherein applying the substantially flat contact surface to the electronic component comprises substantially evenly distributing the substantially flat contact surface across the electronic component.

11. The method of claim 1, wherein applying tension to the electronic component comprises applying tension in a direction substantially perpendicular to the substrate.

* * * * *